United States Patent

Inobe et al.

[11] Patent Number: 4,882,581
[45] Date of Patent: Nov. 21, 1989

[54] KEYBOARD FOR A PORTABLE DATA TERMINAL

[75] Inventors: Kazuhiko Inobe; Masami Kanzaki, both of Yokohama, Japan

[73] Assignee: Matsushita Electric Industrial Co., Ltd., Kadoma, Japan

[21] Appl. No.: 159,440

[22] Filed: Feb. 18, 1988

[30] Foreign Application Priority Data

Feb. 19, 1987 [JP] Japan .................................. 62-36064

[51] Int. Cl.$^4$ ..................... H03M 9/00; H03K 17/967
[52] U.S. Cl. ......................................... 341/22; 341/32; 200/5 A; 200/310
[58] Field of Search ........ 340/365 VL, 365 L, 365 P, 340/712; 341/22, 23, 31, 32; 200/314, 292, 511, 512, 5 R, 5 A; 178/17 C

[56] References Cited

U.S. PATENT DOCUMENTS

| | | | |
|---|---|---|---|
| 3,187,321 | 6/1965 | Kameny | 340/365 VL |
| 4,119,839 | 10/1978 | Beckmann et al. | 341/23 |
| 4,343,975 | 8/1982 | Sado | 200/314 |
| 4,366,463 | 12/1982 | Barker | 340/365 L |
| 4,692,740 | 9/1987 | Washizuka et al. | 340/365 VL |
| 4,743,895 | 5/1988 | Alexander | 340/712 |

Primary Examiner—Donald J. Yusko
Assistant Examiner—Tyrone Queen
Attorney, Agent, or Firm—Spencer & Frank

[57] ABSTRACT

The portable terminal keyboard includes silicone rubber mixed with phosphorescent material used on the external exposed surface of the keyboard and conventional silicone rubber used for the moving parts, so that it is luminous for a certain duration by being irradiated for a while with a light source, thereby facilitating the user's entry operation and also enhancing the durability of the keyboard. The keyboard has its key mat made of a magnetic material so that it is attached by magnetism to the main frame, thereby faciliting replacement with a different key mat. The magnetic key mat structure allows the single access attachment and eliminates such conventional fixtures as lugs, whereby the key mat can be replaced more easily even in darkness and the lugs or the like are not present to be damaged as would be otherwise caused by frequent key mat replacement.

4 Claims, 2 Drawing Sheets

PRIOR ART

KEYBOARD FOR A PORTABLE DATA TERMINAL

BACKGROUND OF THE INVENTION

This invention relates to a keyboard of a portable terminal which is used in dark environments such as the night outdoors.

FIG. 1 shows a portable terminal. The terminal includes a display panel 1 which can be read in the dark owing to the adoption of light emitting display elements or to an illuminating device provided for the case of non-luminant display elements such as liquid crystal elements, and an input panel 2 having operation keys, with the result of each operation appearing on the display panel. However, in order for the above-mentioned conventional panel design to have a luminous input panel, it would be necessary to provide illumination for the wide input panel area, and adding such an illumination device to the portable apparatus is difficult because of a resulting excessive weight and increased manufacturing cost.

A keyboard is known which is made of silicone rubber, however it does not have a luminant property and therefore the operator needs an external light source such a flashlight to recognize each key. Luminant pigments have been known, however, silicone rubber mixed with pigment spoils the working life of rubber in the stressed portion due to frequent operations or creates a disparity in its resilience.

FIG. 2 shows a key mat fitting structure for a conventional portable data terminal. A terminal unit 3 includes a key mat 4 made of a resin or paper sheet, on which key names are labeled. Key functions can be altered by a program stored in the terminal unit, and any key 2 can be given variable roles depending on the purpose of the terminal unit, and therefore the key mat 4 with the label of key names needs to be replaceable. Conventionally, a transparent sheet 5 has been used to settle the key mat 4 for the convenience of replacement. The settling sheet 5 is attached by inserting its four lugs 5a into sockets 3a formed in main frame.

FIG. 3 shows the foregoing structure in more detail. A key switch is turned "on" when a key 2 is pressed by a finger and an associated conductive contact 6 connects contacts 7 provided on a substrate 18. The key 2 has a name which is indicated by the label 11 printed on the key mat 10. The key mat 10 is settled in position by being placed between a main frame 9 and a transparent settling sheet 12 which is fitted as shown in FIG. 2.

However, the foregoing conventional key mat fitting structure compels the user to remove the settling sheet 12 at each replacement of the key mat 10, and it is unsuitable for applications which require frequent key mat replacements. The data terminal is occasionally used in the outdoors, and a key mat fitting structure which allows much easier replacement has been desired.

SUMMARY OF THE INVENTION

An object of this invention is to provide a keyboard structure in which the keyboard luminesces for a certain duration after it has been irradiated with a light source for a while, thereby allowing the user to perform a key entry in the dark while viewing the display panel.

Another object of this invention is to provide a keyboard structure which enables the user to replace the key mat easily in the dark night outdoors.

DESCRIPTION OF THE PREFERRED EMBODIMENTS

Figure 1:
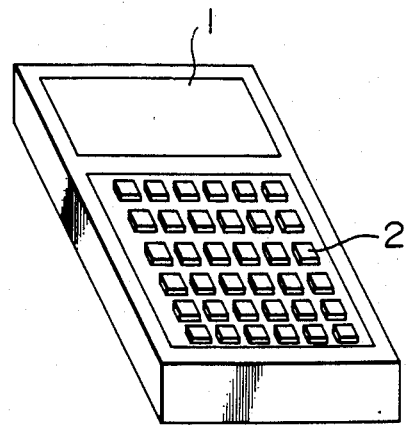
FIG. 1 is a perspective view of a portable data terminal according to the prior art.
Figure 2:
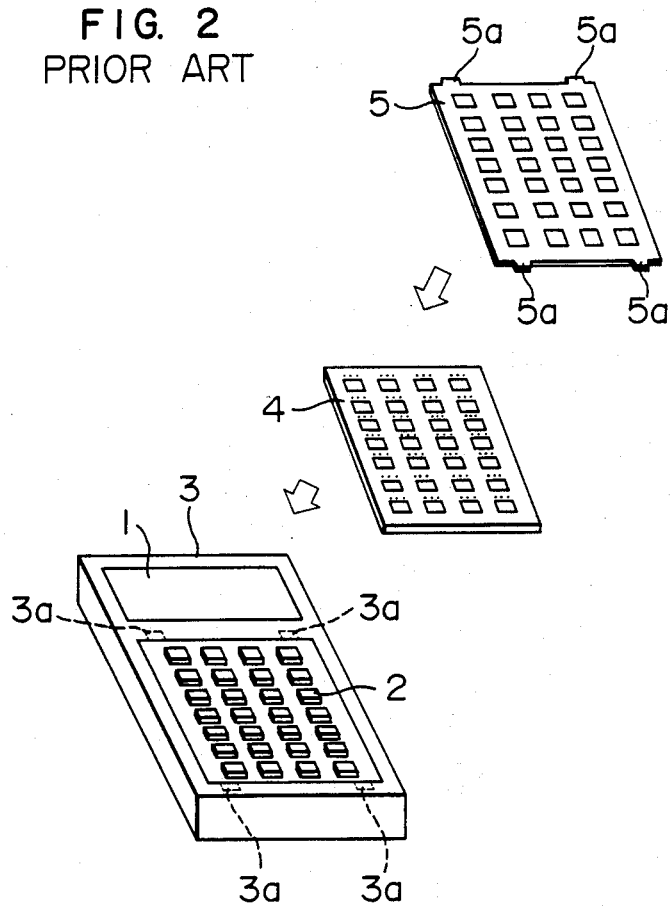
FIG. 2 is a perspective assembly view of the keyboard of FIG. 1 showing the key mat fitting structure.
Figure 3:
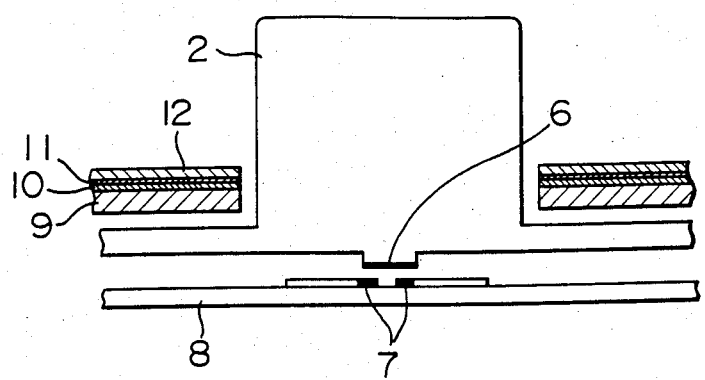
FIG. 3 is a cross-sectional view of the keyboard structure of FIG. 2.
Figure 4:
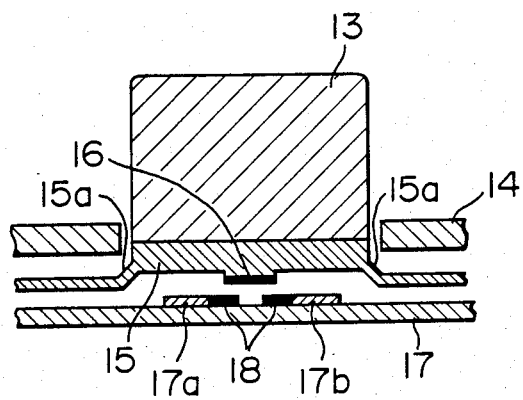
FIG. 4 is a cross-sectional view of a portable terminal keyboard according to the present invention.

FIG. 4 shows a cross section of a portable terminal keyboard embodying the present invention. In the figure, indicated by 13 is a key top of a push switch and it is made of silicone rubber mixed with a phosphorescent mterial such as lead-cadmium sulfide, zinc sulfate (ZnSCu), etc. A portion 15 formed integrally with the key top 13 is made of pure silicon rubber, with its contact skirt section 15a being bent resiliently when the key top 13 is depressed. Indicated by 16 is a key contact affixed to the center of the silicone rubber key bottom 15 and it is made of silicone rubber mixed with carbon to provide conductivity. Indicated by 17 is a substrate with printed wirings 17a and 17b being formed on its surface. A pair of contacts 18 are provided at one end of the printed wiring leads 17a–17b, and these contacts are connected electrically when the key contact 16 comes in contact with them by being pushed through actuation of the key top 13 and contact skirt section 15a.

The keyboard of this embodiment is manufactured by the compression method. Initially, pieces of silicone rubber and phosphorescent material in porportion for making 15–20% phosphorescent material mixed in silicone rubber are placed on the key top side of a metal mold, and only pieces of silicone rubber are placed on the key bottom side of the mold. The mold is closed and pressed at 400 kg/m$^2$ at 180° C. for 7 minutes, and the keyboard is formed.

Next, the operation of the inventive keyboard will be described. In the daytime, the keyboard is used for a portable data terminal by a bank's salesman or stock manager. The operator presses a key top 13, causing the contact skirt section 15a to bend, and the key contact 16 comes in contact with the contacts 18 on the substrate. Then, the printed wiring leads 17a and 17b are connected electrically through the key contact 16, and a signal is transmitted.

At night, it is too dark to read the key label, and the operator irradiates the keyboard 13 with a prepared flashlight for a while. After that, the flashlight is turned off and returned back to a coat pocket or the like, then the operator holds the portable terminal unit by one hand and operates the keyboard 2 by another hand. Since the key tops 13 include a phosphorescent component, the labels on the keyboard 13 can be identified, allowing the operator to hold the portable terminal unit by one hand and operate the keyboard by another hand. By being irradiated by an external light source or by a temporarily reinforced illumination of the display panel for a few minutes, each of the phosphorescent key tops 13 phosphoresces over a period several times the light-charging time length. In practice, the charging light source is available from among a flashlight and reflected light from the display panel, as in this embodiment. The phosphorescent keyboard is also effective when the apparatus is moved from a bright place to a dark place, or when the environment has become dark suddenly, as in the case of power failure.

It should be noted that the contact skirt section 15a is preferably made of pure silicone rubber so as to avoid the adverse effect of phosphorescent material which is an impurity against silicon, in consideration of the tight coupling with the key contact 16, the working life under stress and the disparity of its spring action.

As will be appreciated from the foregoing embodiment, the inventive portable terminal keyboard has its key tops formed of the mixture of silicone rubber and phosphorescent material, its key contacts formed of the mixture of silicone rubber and carbon, and its key top bottom and contact skirt section formed of pure silicon rubber, allowing the user to operate in the night dark after the phosphorescent component has been activated with a flashlight, whereby the apparatus is useful even in the night time and its reliability is retained.

Figure 5:
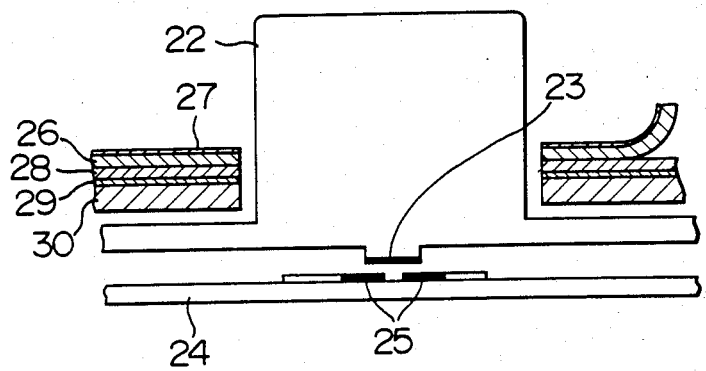
FIG. 5 is a cross-sectional view of the keyboard of FIG. 4 showing a key mat fitting structure according to the invention.

FIG. 5 shows the cross section of a key mat fitting structure according to an embodiment of this invention. A key 22 is pressed by a finger, causing a conductive contact 23 to connect contacts 25 provided on a substrate 24, thereby turning on the switch. The structure for this operation is identical to the conventional ones. In order to display the name of keys 22, a key mat 26 made of a sheet magnetic material is laid, with labels 27 being printed on the mat surface. For settling the key mat 26 on the keyboard, a sheet magnet 28 is attached to a main frame 30 by means of a double-sided adhesive tape 29. Sheet magnets with a thickness of 0.5 mm or less are available currently, and they can be printed on both sides.

One of the sheet magnets 26 and 28 may be formed of a sheet of metal attractive to magnetism, and in this case the metallic sheet needs an additional means of grounding in order to prevent electrostatic influence. It is also possible to print another label on the sheet magnet 28 on its opposite side where the double-sided adhesive tape 29 is absent, so that it serves for a key mat.

As will be appreciated from the above embodiments, the inventive terminal keyboard has its key mat attached or detached very simply by utilization of magnetism, and the reliability and working life of the key mat fixture can be enhanced.

As described above, the inventive keyboard enables the user to use luminous keys on the keyboard in darkness for a duration of time after the keys are irradiated by a light source, while viewing the associated display screen. It also allows the user to replace the key mat easily in darkness.

We claim:

1. A portable terminal keyboard comprising a terminal main unit for collecting and storing data; a substrate having a plurality of pairs of electrical contacts; and a plurality of key tops, each of said plurality of key tops including (a) an upper portion formed of a mixture of silicone rubber and phosphorescent material and arranged to protrude through a case of said main unit, (b) a lower portion which is substantially free of phosphorescent material, and (c) switch means including an electrical contact disposed on said lower portion and operative to come in contact with a respective one of said plurality of pairs of electrical contacts so that said switch means electrically connects the contacted one of said plurality of pairs of electrical contacts in response to depression of the respective key top.

2. A keyboard according to claim 1, wherein each said lower portion has a resiliently deformable contact skirt section which is integrally formed with said lower portion and which is resiliently bent and lowered toward said substrate in response to depression of the respective key top.

3. A keyboard according to claim 2, wherein said electrical contact of said switch means is formed of a mixture of silicone rubber and carbon, so as to be electrically conductive.

4. A keyboard according to claim 2, wherein said lower portion is formed substantially entirely of silicone rubber.

* * * * *